United States Patent
Matsumoto

(10) Patent No.: US 6,842,163 B2
(45) Date of Patent: Jan. 11, 2005

(54) SEMICONDUCTOR DEVICE AND DISPLAY COMPRISING THE SAME

(75) Inventor: Shoichiro Matsumoto, Ogaki (JP)

(73) Assignee: Sanyo Electric Co., Ltd., Osaka (JP)

(*) Notice: Subject to any disclaimer, the term of this patent is extended or adjusted under 35 U.S.C. 154(b) by 322 days.

(21) Appl. No.: 10/091,428

(22) Filed: Mar. 7, 2002

(65) Prior Publication Data

US 2002/0140663 A1 Oct. 3, 2002

(30) Foreign Application Priority Data

Mar. 30, 2001 (JP) ........................................ 2001-098151

(51) Int. Cl.$^7$ ................................................ G09G 3/36
(52) U.S. Cl. ........................................ 345/98; 345/100
(58) Field of Search ............................ 345/87, 94, 98, 345/100, 99, 55, 211, 212

(56) References Cited

U.S. PATENT DOCUMENTS

| 5,786,800 A | * | 7/1998 | Gyouten ...................... 345/98 |
| 6,424,590 B1 | * | 7/2002 | Taruishi et al. ........ 365/230.08 |

FOREIGN PATENT DOCUMENTS

| JP | 9-244585 | 9/1997 |
| JP | 11-085111 | 3/1999 |
| JP | 11-249621 | 9/1999 |
| JP | 2000-075842 A | 3/2000 |
| JP | 2000-221929 A | 8/2000 |

OTHER PUBLICATIONS

Nakajima, et al "A 3.8inch QVGA Reflective Color LCD With Integrated 3b DAC Driver" Sony Corporation, 2000 IEEE International Solid–State Circuits Conference.

* cited by examiner

Primary Examiner—Dennis-Doon Chow
(74) Attorney, Agent, or Firm—McDermott Will & Emery LLP

(57) ABSTRACT

A semiconductor device capable of stably capturing and holding data is obtained. This semiconductor device comprises a data input part, a control part supplying a synchronous signal for capturing a data signal, a data capturing part for capturing the data signal having a prescribed amplitude and determining the data signal while level-converting the data signal of the prescribed amplitude to an amplitude different from the prescribed amplitude in response to the synchronous signal from the control part and a latch part provided independently of the data capturing part for holding the data signal captured in the data capturing part. The data capturing part is substantially connected to a power source at least when capturing the data signal and determining the data signal. Thus, the circuit operation is not unstabilized when capturing the data signal and determining the data signal, whereby the data signal can be stably captured and determined. The latch part is provided independently of the data capturing part, whereby the data signal captured by the data capturing part is stably held.

16 Claims, 6 Drawing Sheets

OPERATION WAVEFORM

SEMICONDUCTOR DEVICE AND DISPLAY COMPRISING THE SAME

BACKGROUND OF THE INVENTION

1. Field of the Invention

The present invention relates to a semiconductor device and a display comprising the same, and more particularly, it relates to a semiconductor device employed for capturing a video signal or the like in a display and a display comprising the same.

2. Description of the Prior Art

A circuit having functions of capturing a low amplitude signal with a certain starting signal, level-converting the signal voltage and holding data thereof is known in general. Such a circuit is employed for capturing addresses and data and holding the data in a memory, for example. This circuit is also employed for capturing a video signal and holding data in a liquid crystal display (LAD) or an organic EL (electro luminescence) display. The following description is made with reference to a circuit for capturing a video signal and holding data in an LCD.

An LCD employing a polysilicon TFT (thin-film transistor) is recently increasingly demanded. Following this, reduction of power consumption and attainment of a digital interface are required to an LCD system.

In order to reduce power consumption in the LCD system, efficiency of a power supply circuit must be increased and a driving voltage must be reduced. The polysilicon TFT having higher performance than an amorphous silicon TFT is applied to an LCD and put into practice mainly for a miniature LCD panel. However, the polysilicon TFT having higher performance than the amorphous silicon TFT is still inferior in performance as compared with a single-crystalline silicon transistor formed on the surface of a silicon substrate. In order to obtain a driving current similar to that in a single-crystalline silicon transistor having an operating voltage of about 3 V, therefore, the polysilicon TFT requires a power supply voltage of 12 to 15 V. Therefore, while the power source for a control IC of the LCD is about 3 V, a level conversion circuit is required for converting the voltage to 12 to 15 V.

In general, therefore, a circuit provided in an LCD panel performs level conversion of a voltage while only a 3 V-system signal is input in the LCD panel. The level conversion circuit is so built into the LCD panel that a level-converted high voltage can be applied to only a necessary portion in the panel while supplying a 3 V-system voltage to the remaining portions. Thus, power consumption can be reduced.

The LCD (liquid crystal display) makes bright/dark display by applying a voltage across a liquid crystal material thereby fluctuating the transmittance of the liquid crystal material. In this case, a counter electrode AC driving system is generally employed for AC-driving a second electrode (counter electrode) different from a first electrode of a display pixel subjected to application of video data thereby halving the amplitude of the video data. Thus, the voltage of a video signal can be reduced thereby reducing power consumption of an external IC as well as that in the panel.

Due to the aforementioned reduction of the power consumption, the voltages of a clock signal and the video signal other than that related to the performance of the polysilicon TFT can be reduced.

In general, requirement for digitization (digital interfacing) of treated signals is increased following reduction of the voltage of the video signal and rapid development of the Internet and the digital signal technique. In particular, the analog video signal is hard to treat in view of digitization. In order to digitize video data, a technique of building a DAC (digital-analog converter) into an LCD panel for converting a digital video signal to an analog video signal is proposed.

In consideration of the above, development of a circuit capable of inputting a video signal in an LCD panel with a 3 V-system digital signal as well as capturing the digital signal and level-converting a power supply voltage in the panel is recently started. Such a circuit is disclosed in 2000 IEEE International Solid-State Circuits Conference, announcement No. TA 11.5 (pp. 188–189) or the like, for example.

FIG. 10 is a circuit diagram showing the circuit structure of a conventional video signal capturing circuit disclosed in the aforementioned literature. Referring to FIG. 10, a conventional data capturing part 101 includes two p-channel transistors PT101 and PT102 and two n-channel transistors NT101 and NT102. Either the source terminals or the drain terminals of the p-channel transistors PT101 and PT102 are connected to a power supply voltage VDD through a switch SW3. The other one of the source terminal and the drain terminal of the p-channel transistor PT101 is connected to either the source terminal or the drain terminal of the n-channel transistor 101. The other one of the source terminal and the drain terminal of the n-channel transistor NT101 is connected to a ground potential GND. The gate terminals of the p-channel transistor PT101 and the n-channel transistor NT101 are connected to a data line Data through a switch SW1.

The other one of the source terminal and the drain terminal of the p-channel transistor PT102 is connected to either the source terminal or the drain terminal of the n-channel transistor NT102. The other one of the source terminal and the drain terminal of the n-channel transistor NT102 is connected to the ground potential GND. The gate terminals of the p-channel transistor PT102 and the n-channel transistor NT102 are connected to an inverted data line /Data through a switch SW2.

The conventional data capturing part 101 having the aforementioned structure has three functions, i.e., a data sensing function of determining data, a function of level-converting a power source and a function of latching captured data. The switches SW1 and SW2 have functions of starting capturing data by entering ON states in synchronization with a sampling pulse. The switch SW3 has a function of entering an OFF state in synchronization with the sampling pulse for stopping charge supply to the data capturing part 101 from the power source (VDD) in data capturing. Two inverter circuits 131 and 132 of an output stage have functions of waveform-shaping captured data and transmitting signals to a subsequent stage.

FIG. 11 illustrates operation timings and operation waveforms of the conventional video signal capturing circuit shown in FIG. 10. The operations of the conventional video signal capturing circuit are now described with reference to FIGS. 10 and 11.

First, a start signal (not shown in FIG. 10) indicating operation initiation of a display panel of an LCD itself goes high, as shown in FIG. 11. Thus, a signal STH indicating starting of a horizontal driving circuit goes high. According to generation of this signal STH, the sampling pulse for capturing video data Data and /Data goes high in synchronization with horizontal basic clocks HCK1 and HCK2.

Thus, the switches SW1 and SW2 enter ON states while the switch SW3 enters an OFF state. Therefore, data is input in the data capturing part 101 while cutting off the power source VDD from the data capturing part 101.

The data capturing part 101 determines the data. When the data capturing part 101 completely determines the data and nodes A and B reach voltages corresponding to the video data Data and /Data, the switch SW3 enters an ON state. Thus, the data capturing part 101 and the power source VDD are connected with each other for defining the captured data, level-converting voltages and holding the data.

In the conventional video signal capturing circuit shown in FIG. 10, however, the data capturing part 101 is cut off from the power source VDD (9 V) when capturing and determining the data, and hence the circuit operation of the data capturing part 101 may be unstable. In this case, it may disadvantageously be difficult to stably capture, determine and hold the data. In the conventional video signal capturing circuit shown in FIG. 10, further, the data capturing part 101 has a symmetrical circuit structure with respect to the input data, and hence the degree of freedom in layout is so small that the layout area cannot be satisfactorily minimized.

SUMMARY OF THE INVENTION

An object of the present invention is to provide a semiconductor device capable of stably capturing data and stably holding the captured data.

Another object of the present invention is to provide a semiconductor device suitable for minimizing the layout area in relation to the aforementioned semiconductor device.

Still another object of the present invention is to reliably capture data at a high speed in the aforementioned semiconductor device.

A further object of the present invention is to provide a display comprising the aforementioned semiconductor device.

A semiconductor device according to a first aspect of the present invention comprises a data input part for receiving a data signal having a prescribed amplitude, a control part supplying a synchronous signal for capturing the data signal, a data capturing part for capturing the data signal having the prescribed amplitude and determining the data signal while level-converting the data signal of the prescribed amplitude to an amplitude different from the prescribed amplitude in response to the synchronous signal from the control part, and a latch part provided independently of the data capturing part for holding the data signal captured in the data capturing part. The data capturing part is substantially connected to a power source at least when capturing the data signal and determining the data signal.

In the semiconductor device according to the first aspect, the data capturing part is substantially connected to the power source at least when capturing the data signal and determining the data signal as hereinabove described, whereby the circuit operation is not unstabilized when capturing and determining the data signal and hence the data signal can be stably captured and determined. The latch part for holding the captured data signal is provided independently of the data capturing part, whereby the data signal captured by the data capturing part can be stably held.

The aforementioned semiconductor device according to the first aspect preferably includes a pair of data input parts and a pair of data capturing parts respectively along with a single latch part. According to this structure, the semiconductor device more hardly causes an error in data determination as compared with a device having a single data capturing part, whereby stability in capturing and determination of data can be improved.

In the aforementioned semiconductor device according to the first aspect, the data capturing part preferably has an asymmetrical circuit structure as viewed from the data input part. According to this structure, the degree of freedom in layout is increased as compared with a symmetrical circuit structure as viewed from the data input part, whereby the layout area can be readily minimized.

In the aforementioned semiconductor device according to the first aspect, the data input part preferably includes a data line and an inverted data line, and the data capturing part preferably includes a first p-channel transistor having either a source terminal or a drain terminal connected to the power source with the remaining terminal electrically connected to a first node along with a gate terminal connected to the control part and a first n-channel transistor having either a source terminal or a drain terminal connected to the first node with the remaining terminal electrically connected to the inverted data line along with a gate terminal electrically connected to the data line. The latch part includes a first inverter circuit for inverting the potential of the first node, a second node connected to an output terminal of the first inverter circuit and a second inverter circuit connected to the output terminal and an input terminal of the first inverter circuit. The first p-channel transistor enters an ON state and the first n-channel transistor enters an OFF state so that the first node reaches a high-level potential and the second node goes low when the data line is low. The first p-channel transistor enters an ON state and the first n-channel transistor enters an ON state so that the first node reaches a low-level potential and the second node goes high when the data line is high. According to this structure, data can be readily stably captured and held.

In the aforementioned semiconductor device having the first p-channel transistor and the first n-channel transistor, the resistance ratio between the first p-channel transistor and the first n-channel transistor is preferably so set that the first node goes low when a current flows to the first p-channel transistor and the first n-channel transistor. According to this structure, the first node can readily go low when the current flows to the first p-channel transistor and the first n-channel transistor.

In the aforementioned semiconductor device having the first p-channel transistor and the first n-channel transistor, the control part preferably includes a transfer gate arranged between the first node of the data capturing part and the first inverter circuit of the latch part and a third inverter circuit for inverting the synchronous signal. According to this structure, the potential of the first node can be readily transferred to the latch part in response to the synchronous signal.

In the aforementioned semiconductor device having the first p-channel transistor and the first n-channel transistor, the data capturing part preferably further includes a second p-channel transistor arranged between the first p-channel transistor and the first node so that its gate terminal is connected to the data line. According to this structure, the degree of activation of the second p-channel transistor is reduced (resistance is increased) when the data line is high, whereby charge supply from the first p-channel transistor to the first node is suppressed. Thus, the current can be prevented from excessively flowing and prompting the first node to readily go high. Therefore, the first node can readily go low when the data line is high. Consequently, stability of the circuit operation can be further improved.

In the aforementioned semiconductor device having the first p-channel transistor and the first n-channel transistor, the data capturing part preferably further includes a third p-channel transistor having either a source terminal or a drain terminal connected to the power source with the remaining terminal connected to the gate terminal of the first n-channel transistor along with a gate terminal connected to the control part and a fourth p-channel transistor having either a source terminal or a drain terminal connected to the third p-channel transistor with the remaining terminal grounded along with a gate terminal electrically connected to the data line. According to this structure, the power source supplies the voltage to the gate terminal of the first n-channel transistor while the degree of activation of the fourth p-channel transistor is reduced (resistance is increased) when the data line is high, whereby the gate potential of the first n-channel transistor is increased. Thus, the first n-channel transistor readily enters an ON state. Consequently, data can be reliably captured at a high speed.

In this case, the control part preferably includes a third inverter circuit, and the first p-channel transistor and the third p-channel transistor are preferably driven by the synchronous signal through the third inverter circuit of the control part. According to this structure, the number of elements directly driven by the synchronous signal can be reduced, whereby the load of the synchronous signal can be reduced.

In the aforementioned semiconductor device having the first p-channel transistor and the first n-channel transistor, the data capturing part preferably further includes a third p-channel transistor having either a source terminal or a drain terminal connected to the power source with the remaining terminal connected to the gate terminal of the first n-channel transistor along with a gate terminal connected to the control part and a fourth p-channel transistor having either a source terminal or a drain terminal connected to the third p-channel transistor with the remaining terminal electrically connected to the data line along with a gate terminal electrically connected to the data line. According to this structure, the power source supplies the voltage to the gate terminal of the first n-channel transistor while the degree of activation of the fourth p-channel transistor is reduced (resistance is increased) and the other one of the source terminal and the drain terminal of the fourth p-channel transistor goes high when the data line is high, whereby the gate potential of the first n-channel transistor is further increased. Thus, the first n-channel transistor further readily enters an ON state. Consequently, data can be more reliably captured at a higher speed.

In this case, the control part preferably includes a third inverter circuit, and the first p-channel transistor and the third p-channel transistor are preferably driven by the synchronous signal through the third inverter circuit of the control part. According to this structure, the number of elements directly driven by the synchronous signal can be reduced, whereby the load of the synchronous signal can be reduced.

In the aforementioned semiconductor device according to the first aspect, the control part preferably includes a first switching element arranged between the data input part and the data capturing part to enter in an ON state in response to the synchronous signal when capturing the data signal. According to this structure, the data input part is cut off from the data capturing part in operations other than data capturing, whereby the load balance of the data line and the inverted data line forming the data input part can be rendered uniform. In this case, the data input part preferably includes a data line and an inverted data line, and the first switching element preferably includes a second n-channel transistor connected to the data line and a third n-channel transistor connected to the inverted data line. According to this structure, the data input part can be readily cut off from the data capturing part in operations other than data capturing through the second and third n-channel transistors. In this case, the control part may further include a third inverter circuit for inverting the synchronous signal.

In the aforementioned semiconductor device according to the first aspect, the power source may include an internal power source.

A display according to a second aspect of the present invention comprises the aforementioned semiconductor device according to the first aspect. According to this structure, data can be stably captured when employing the semiconductor device according to the first aspect as a video signal capturing circuit in the display, for example. In this case, the display may include either a liquid crystal display or an organic EL display.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. While a semiconductor device according to the present invention is employed as a video data capturing circuit of a liquid crystal display (LCD) in each of the following embodiments, the present invention is not restricted to this.

(First Embodiment)

Figure 1:
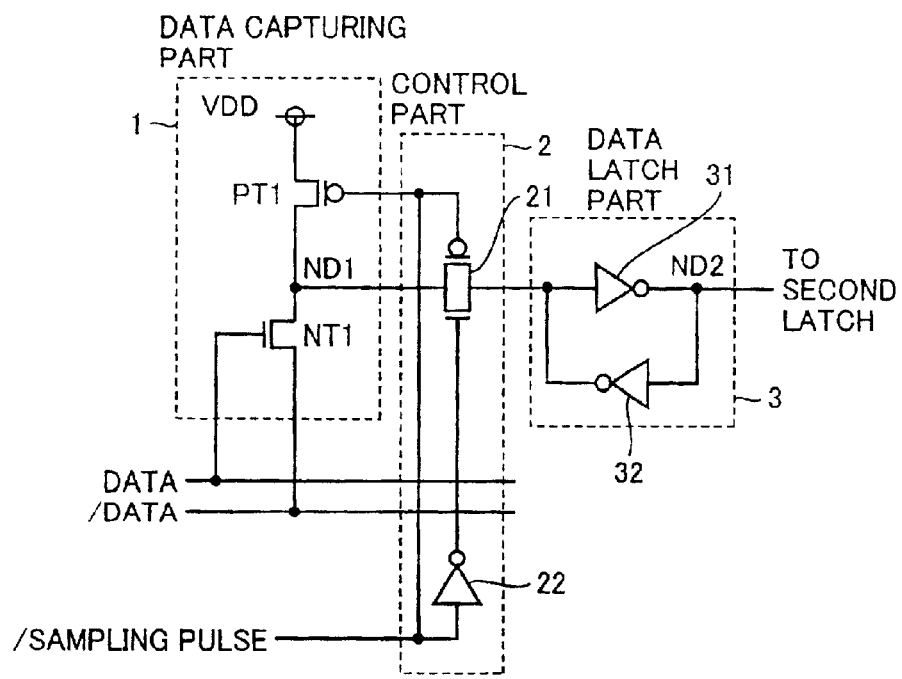
FIG. 1 is a circuit diagram showing the circuit structure of a semiconductor device (data capturing circuit) according to a first embodiment of the present invention.

Referring to FIG. 1, a data capturing circuit according to a first embodiment of the present invention comprises a data capturing part 1, a control part 2 and a data latch part 3. The data latch part 3 is an example of the "latch part" according to the present invention. The data capturing part 1 has two functions, i.e., a sensing function of determining data and a function of level-converting a power supply voltage.

The data capturing part 1 includes two transistors, i.e., a p-channel transistor PT1 and an n-channel transistor NT1. Either the source terminal or the drain terminal of the p-channel transistor PT1 is connected to a terminal of a power supply voltage VDD (9 V), and the other terminal is connected to a node ND1. Either the source terminal or the drain terminal of the n-channel transistor NT1 is connected to the node ND1, and the other terminal is connected to an inverted data line /Data. The gate terminal of the p-channel transistor PT1 is connected to the control part 2, and the gate terminal of the n-channel transistor NT1 is connected to a data line Data.

The p-channel transistor PT1 is an example of the "first p-channel transistor" according to the present invention, and the n-channel transistor NT1 is an example of the "first n-channel transistor" according to the present invention. The node ND1 is an example of the "first node" according to the present invention. The data line Data and the inverted data line /Data are examples of the "data input part" according to the present invention.

The control part 2 has a function of supplying a synchronous signal (/Sampling Pulse) to the data capturing part 1. This control part 2 includes a transfer gate 21 and an inverter circuit 22. The transistor gate 21 is formed by interconnecting source terminals and drain terminals of a p-channel transistor and an n-channel transistor with each other. The inverter circuit 22 has an input terminal connected to a synchronous signal line and an output terminal connected to the gate terminal of the n-channel transistor of the transfer gate 21. The gate terminal of the p-channel transistor of the transfer gate 21 is connected to the synchronous signal line.

The data latch part 3 has a function for holding data. This data latch part 3 includes inverter circuits 31 and 32. The inverter circuits 31 and 32 are examples of the "first inverter circuit" and the "second inverter circuit" according to the present invention respectively. An input terminal of the inverter circuit 31 is connected to the node ND1 of the data capturing part 1 through the transfer gate 21 of the control part 2. An output terminal of the inverter circuit 31 is connected to a node ND2. This node ND2 is an example of the "second node" according to the present invention. The node ND2 is connected to an input terminal of the inverter circuit 32, and an output terminal of the inverter circuit 32 is connected to the input terminal of the inverter circuit 31.

Figure 2:
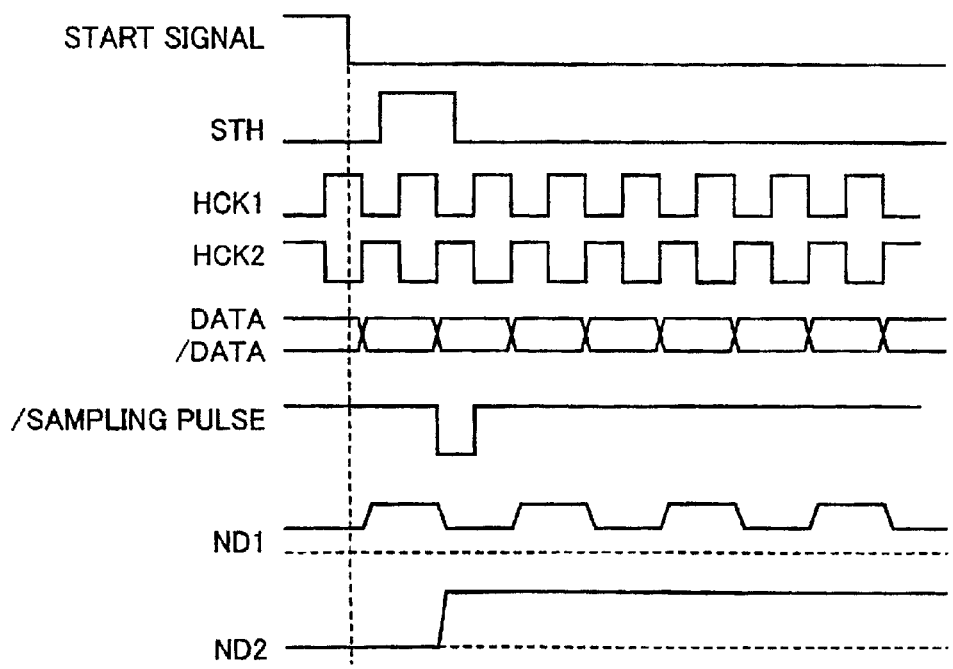
FIG. 2 illustrates operation timings and operation waveforms in the semiconductor device according to the first embodiment shown in FIG. 1.

Operations of the data capturing circuit according to the first embodiment having the aforementioned structure are described with reference to FIGS. 1 and 2.

When video data Data and /Data are high (3 V) and low (0 V) respectively, the n-channel transistor NT1 is in an ON state. Therefore, a low-level potential appears at the node ND1. When a start signal indicating operation initiation of a display panel of an LCD itself goes high in this state, a signal STH indicating starting of a horizontal driving circuit goes high. Due to generation of this signal STH, the sampling pulse (/Sampling Pulse) for capturing the video data Data and /Data goes low in synchronization with horizontal basic clocks HCK1 and HCK2. When the sampling pulse (/Sampling Pulse) goes low, the control part 2 supplies the synchronous signal (/Sampling Pulse) to the p-channel transistor PT1. Thus, a current flows from the p-channel transistor PT1 to the n-channel transistor NT1.

In this case, the resistance ratio between the p-channel transistor PT1 and the n-channel transistor NT1 is so designed that the node ND1 goes low when a current flows to the p-channel transistor PT1 and the n-channel transistor NT1. In other words, the resistance of the p-channel transistor PT1 is designed to be higher than that of the n-channel transistor NT1.

In the aforementioned case, the node ND1 is low and hence a low level is input in the input terminal of the inverter circuit 31 through the transfer gate 21 of the control part 2. Thus, the node ND2 goes high. The data latch part 3 holds the high level of the node ND2.

When the video data Data and /Data are low (0 V) and high (3 V) respectively, the n-channel transistor NT1 of the data capturing part 1 is in an OFF state. When the synchronous signal (/Sampling Pulse) goes low in this case, the control part 2 supplies the synchronous signal (/Sampling Pulse) to the gate terminal of the p-channel transistor PT1 of the data capturing part 1. Thus, the p-channel transistor PT1 enters an ON state. In this state, the high level of the node ND1 is level-converted with the power supply voltage VDD (9 V), to reach the voltage 9 V.

When the node ND1 is high, a high-level signal is supplied to the input terminal of the inverter circuit 31 through the transfer gate 21 of the control part 2. Thus, the node ND2 connected to the output terminal of the inverter circuit 31 goes low. Consequently, the data latch part 3 holds the low-level signal of the node ND2.

According to the first embodiment, the data capturing part 1 is connected to the power supply voltage VDD when capturing and determining a data signal as hereinabove described, whereby the circuit operation is not unstabilized when capturing and determining the data signal and hence the data can be stably captured and determined. The data latch part 3 for holding the captured data signal is provided independently of the data capturing part 1, whereby the data captured by the data capturing part 1 can be stably held.

Figure 10:
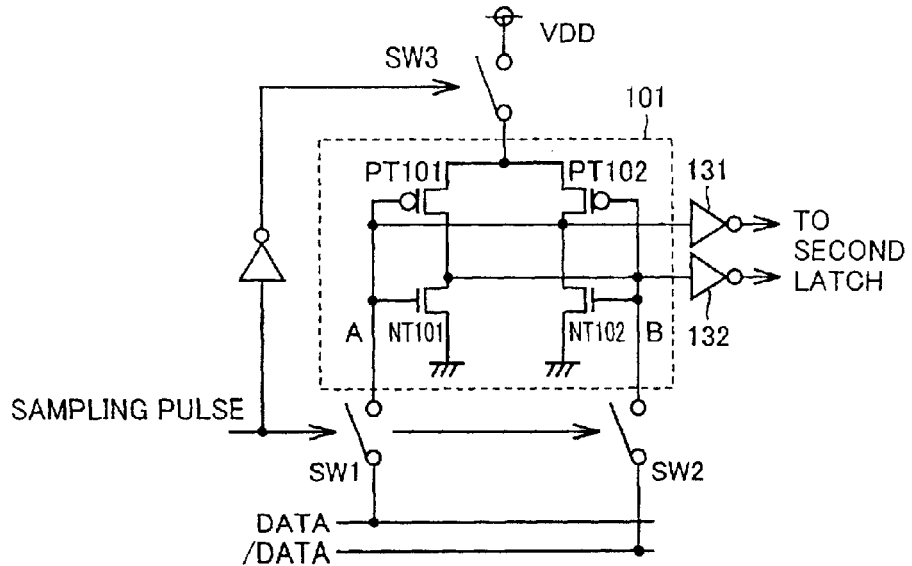
FIG. 10 is a circuit diagram showing the circuit structure of a conventional semiconductor device (data capturing circuit)
Figure 11:
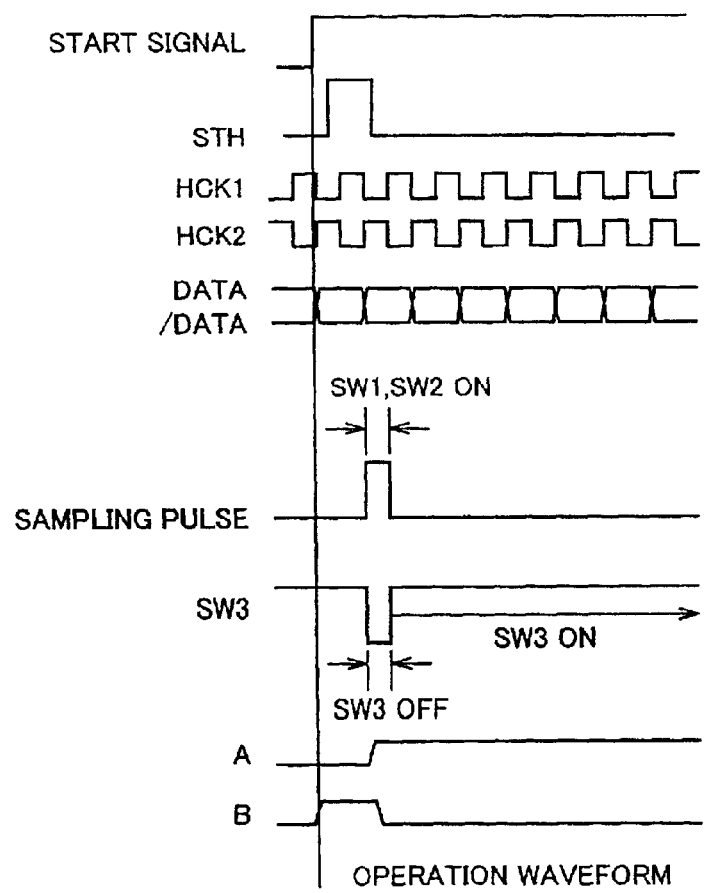
FIG. 11 illustrates operation timings and operation waveforms of the conventional semiconductor device shown in FIG. 10.

According to the first embodiment, the data capturing part 1 has an asymmetrical structure as viewed from the data input part (the data lines Data and /Data), whereby the degree of freedom in layout is increased as compared with the conventional symmetrical circuit structure as viewed from the data input part shown in FIG. 10 and hence the layout area can be readily minimized.

(Second Embodiment)

Figure 3:
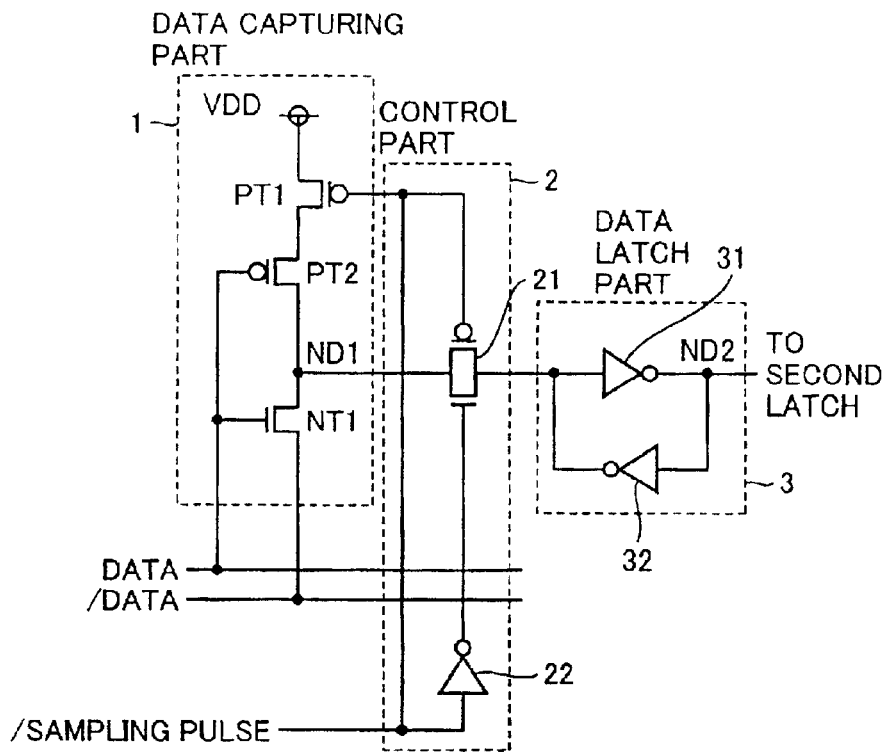
FIG. 3 is a circuit diagram showing the circuit structure of a semiconductor device (data capturing circuit) according to a second embodiment of the present invention.

Referring to FIG. 3, a data capturing circuit according to a second embodiment of the present invention has a circuit structure obtained by adding a p-channel transistor PT2 to a data capturing part 1 in a data capturing circuit similar to that according to the first embodiment shown in FIG. 1. The p-channel transistor PT2 is an example of the "second p-channel transistor" according to the present invention. The remaining structure of the data capturing circuit according to the second embodiment is similar to that of the aforementioned first embodiment.

According to the second embodiment, the p-channel transistor PT2 is added to the data capturing part 1 as described above, whereby the degree of activation of the p-channel transistor PT2 is reduced (resistance is increased) when a data line is high, thereby suppressing charge supply from an p-channel transistor PT1 to a node ND1. Thus, a current can be prevented from excessively flowing and prompting the node ND1 to readily go high. When the data line is high, therefore, the node ND1 can readily go low. Consequently, stability of the circuit operation can be more improved.

(Third Embodiment)

Figure 4:
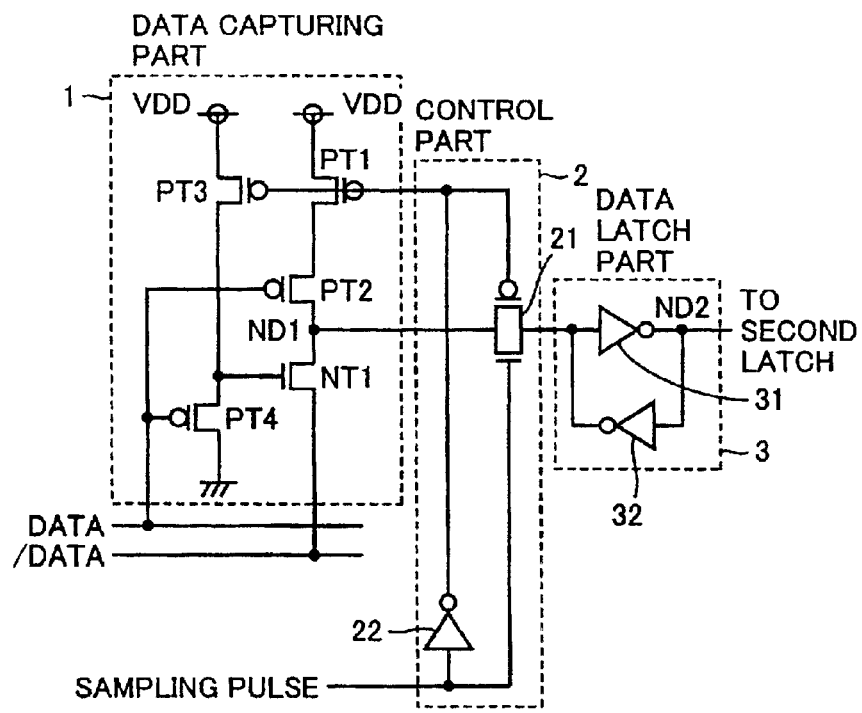
FIG. 4 is a circuit diagram showing the circuit structure of a semiconductor device (data capturing circuit) according to a third embodiment of the present invention.

Referring to FIG. 4, a data capturing circuit according to a third embodiment of the present invention has a structure obtained by adding p-channel transistors PT3 and PT4 to a data capturing part 1 in a structure similar to that of the second embodiment shown in FIG. 3. The p-channel transistor PT3 is an example of the "third p-channel transistor" according to the present invention, and the p-channel transistor PT4 is an example of the "fourth p-channel transistor" according to the present invention. The remaining structure of the data capturing circuit according to the third embodiment is similar to that of the aforementioned second embodiment.

According to the third embodiment, either a source terminal or a drain terminal of the p-channel transistor PT3 is connected to a terminal of a power supply voltage VDD and the remaining terminal is connected to either a source terminal or a drain terminal of the p-channel transistor PT4, as shown in FIG. 4. The other one of the source terminal and the drain terminal of the p-channel transistor PT4 is connected to a ground potential GND. The junction between the p-channel transistors PT3 and PT4 is connected to a gate terminal of an n-channel transistor NT1. Both of gate terminals of a p-channel transistor PT2 and the p-channel transistor PT4 are connected to a data line Data. A gate terminal of the p-channel transistor PT3 is connected to a synchronous signal line of a control part 2.

According to the third embodiment, the p-channel transistors PT3 an PT4 are added to the data capturing part 1 as hereinabove described, whereby the power supply voltage VDD (9 V) supplies a voltage to the gate terminal of the n-channel transistor NT1 while the degree of activation of the p-channel transistor PT4 is reduced (resistance is increased) when the data line Data is high, and hence the gate potential of the n-channel transistor NT1 is increased. Thus, the n-channel transistor NT1 more readily enters an ON state as compared with the aforementioned first and second embodiments. Consequently, data can be reliably captured at a high speed.

According to the third embodiment, the polarity of a sampling pulse is changed as compared with the aforementioned first and second embodiments. In other words, the sampling pulse is activated at a high level while a p-channel transistor PT1 and the p-channel transistors PT2 to PT4 are driven through an inverter circuit 22, whereby the number of elements directly driven with the sampling pulse can be reduced. Thus, the load of the sampling pulse can be reduced.

(Fourth Embodiment)

Figure 5:
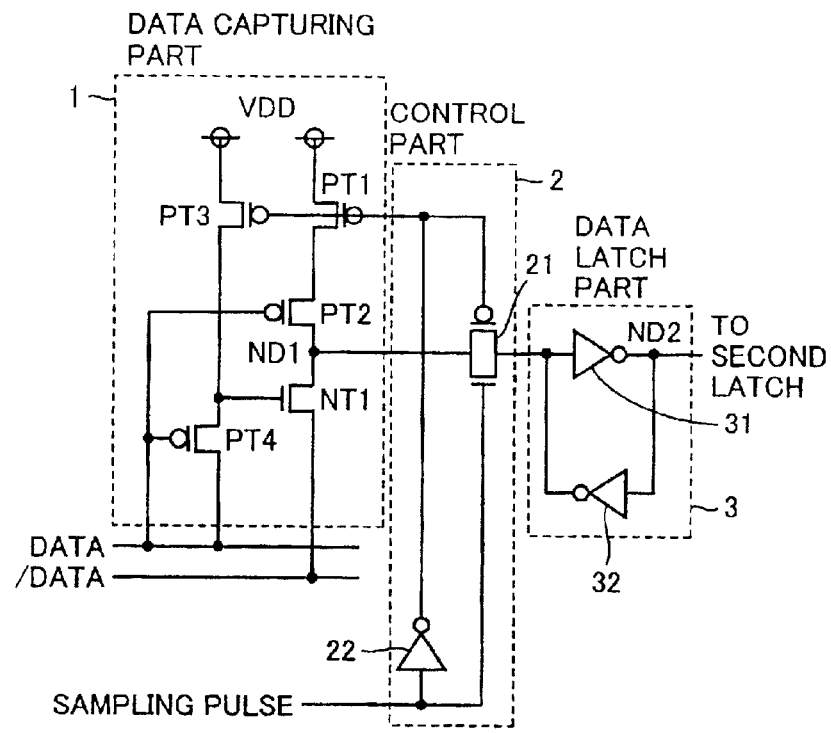
FIG. 5 is a circuit diagram showing the circuit structure of a semiconductor device (data capturing circuit) according to a fourth embodiment of the present invention.

Referring to FIG. 5, the other one of a source terminal and a drain terminal of a p-channel transistor PT4 is connected to the same data line Data as a gate terminal from a ground potential GND in a data capturing circuit according to a fourth embodiment of the present invention, in a structure similar to that of the third embodiment shown in FIG. 4.

According to the fourth embodiment, the other one of the source terminal and the drain terminal of the p-channel transistor PT4 is connected to the data line Data as described above, whereby a gate potential of an n-channel transistor NT1 reaches a higher level as compared with the third embodiment shown in FIG. 4 when data on the data line Data is high, whereby the n-channel transistor NT1 can more readily enter an ON state as compared with the third embodiment. Consequently, data can be more reliably captured at a higher speed. Thus, current consumption can be reduced.

(Fifth Embodiment)

Figure 6:
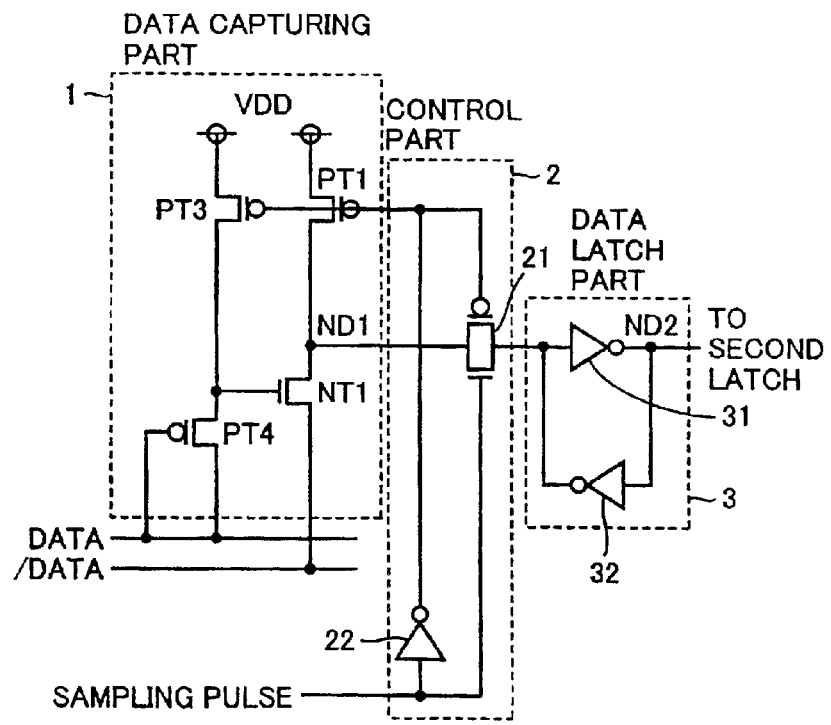
FIG. 6 is a circuit diagram showing the circuit structure of a semiconductor device (data capturing circuit) according to a fifth embodiment of the present invention.

Referring to FIG. 6, a data capturing circuit according to a fifth embodiment of the present invention has a circuit structure obtained by deleting a p-channel transistor PT2 in a structure similar to that of the fourth embodiment shown in FIG. 5. In other words, the data capturing circuit according to the fifth embodiment shown in FIG. 6 has a circuit structure of controlling a gate potential of an n-channel transistor NT1 by adding p-channel transistors PT3 and PT4 to a circuit structure similar to that of the first embodiment shown in FIG. 1.

According to the fifth embodiment, the p-channel transistors PT3 and PT4 are so added that a power supply voltage VDD (9 V) supplies a voltage to a gate terminal of the n-channel transistor NT1 while the degree of activation of the p-channel transistor PT4 is reduced (resistance is increased) when a data line is high, whereby the gate potential of the n-channel transistor NT1 is increased. Thus, the n-channel transistor NT1 more readily enters an ON state as compared with the aforementioned first embodiment. Consequently, data can be reliably captured at a high speed.

(Sixth Embodiment)

Figure 7:
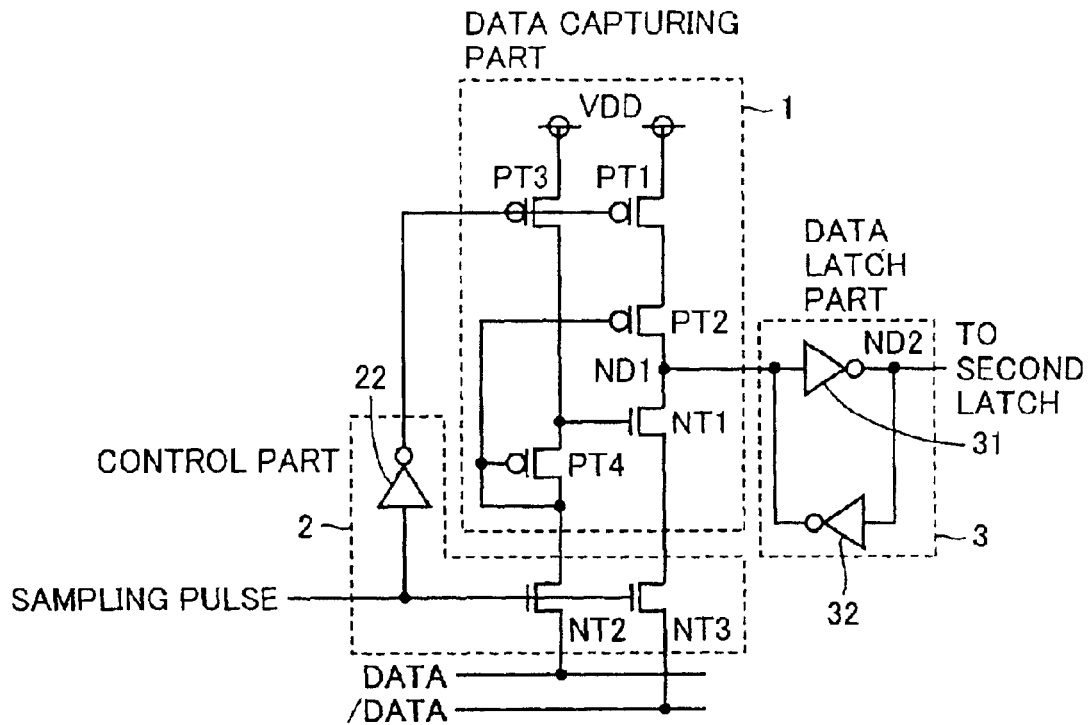
FIG. 7 is a circuit diagram showing the circuit structure of a semiconductor device (data capturing circuit) according to a sixth embodiment of the present invention.

Referring to FIG. 7, a data capturing circuit according to a sixth embodiment of the present invention has a circuit structure of controlling data input by n-channel transistors NT2 and NT3 while deleting a data transfer function in a control part 2 in a structure similar to that of the fourth embodiment shown in FIG. 5. In other words, the structures of a data capturing part 1 and a data latch part 3 of the data capturing circuit according to the sixth embodiment are similar to those of the fourth embodiment shown in FIG. 5, while the control part 2 has a different structure.

According to the sixth embodiment, the control part 2 includes an inverter circuit 22 for inverting a signal of a sampling pulse and the n-channel transistors NT2 and NT3 arranged between the data capturing part 1 and a data input part (data lines Data and /Data) for entering an ON state in response to the sampling pulse when capturing data, as shown in FIG. 7. The n-channel transistors NT2 and NT3 are examples of the "first switching element" according to the present invention.

According to the sixth embodiment, the n-channel transistors NT2 and NT3 are provided on the control part 2 as hereinabove described, whereby the data input part and the data capturing part 1 are cut off from each other in operations other than data capturing, so that the load balance of the data line Data and an inverted data line /Data forming the data input part can be rendered uniform.

According to the sixth embodiment, the data capturing part 1 is connected to a power supply voltage VDD when capturing and determining a data signal similarly to the aforementioned first to fifth embodiments so that the circuit operation is not unstabilized when capturing and determining the data signal, whereby the data can be stably captured and determined. The data latch part 3 for holding the captured data signal is provided independently of the data capturing part 1, whereby the data captured by the data capturing part 1 can be stably held.

According to the sixth embodiment, the data capturing part 1 has an asymmetrical structure as viewed from the data input part (the data lines Data and /Data) similarly to the aforementioned first to fifth embodiments, whereby the degree of freedom in layout is increased as compared with the conventional symmetrical circuit structure as viewed from the data input part shown in FIG. 10 and hence the layout area can be readily minimized.

According to the sixth embodiment, a p-channel transistor PT2 is added between a p-channel transistor PT1 and the n-channel transistor NT1 of the data capturing part 1 similarly to the aforementioned second to fourth embodiments, whereby the degree of activation of the p-channel transistor PT2 is reduced (resistance is increased) when the data line Data is high, and hence charge supply from the p-channel transistor PT1 to a node ND1 is suppressed. Thus, a current can be prevented from excessively flowing and prompting the node ND1 to readily go high. Therefore, the node ND1 can readily go low when the data line Data is high. Consequently, stability of the circuit operation can be more improved.

According to the sixth embodiment, further, p-channel transistors PT3 and PT4 for controlling the gate potential of the n-channel transistor NT1 are provided on the data capturing part 1 similarly to the aforementioned third to fifth embodiments, whereby the power supply voltage VDD (9 D) supplies a voltage to a gate terminal of the n-channel transistor NT1 while the degree of activation of the p-channel transistor PT4 is reduced (resistance is increased) when the data line Data is high, and hence the gate potential of the n-channel transistor NT1 is increased. Thus, the n-channel transistor NT1 more readily enters an ON state as compared with the aforementioned first and second embodiments. Consequently, data can be reliably captured at a high speed.

(Seventh Embodiment)

Figure 8:
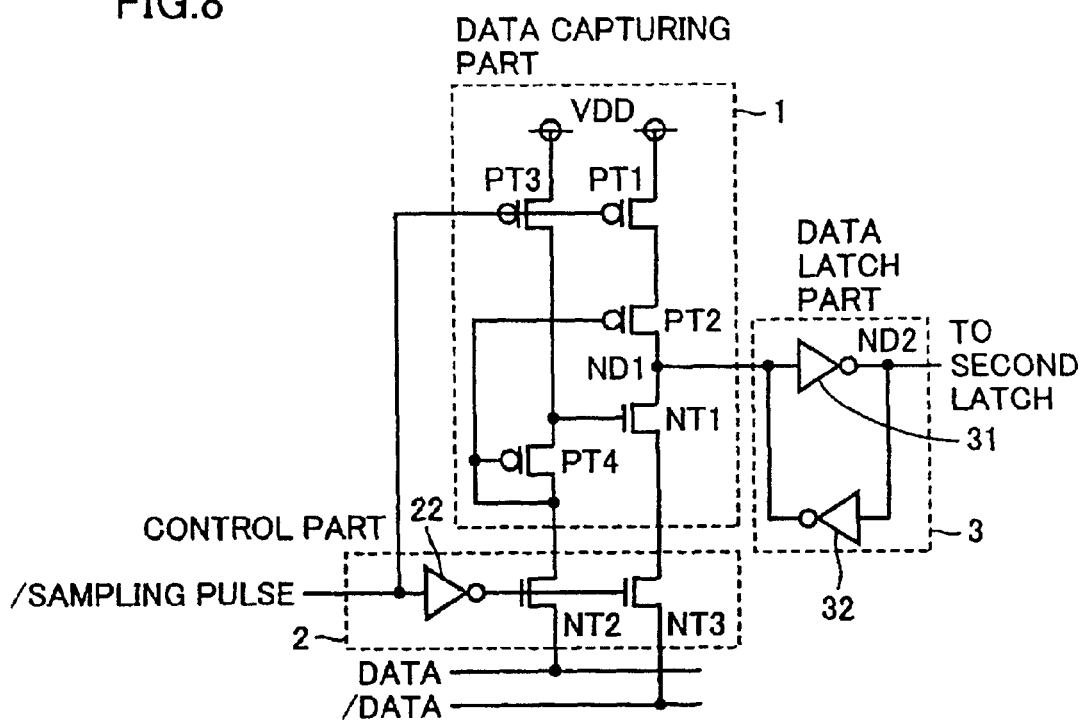
FIG. 8 is a circuit diagram showing the circuit structure of a semiconductor device (data capturing circuit) according to a seventh embodiment of the present invention.

Referring to FIG. 8, a data capturing circuit according to a seventh embodiment of the present invention has a circuit structure obtained by changing the polarity of a sampling pulse in a structure similar to that of the sixth embodiment shown in FIG. 7. Also according to this structure, an effect similar to that of the aforementioned sixth embodiment can be attained.

(Eighth Embodiment)

Figure 9:
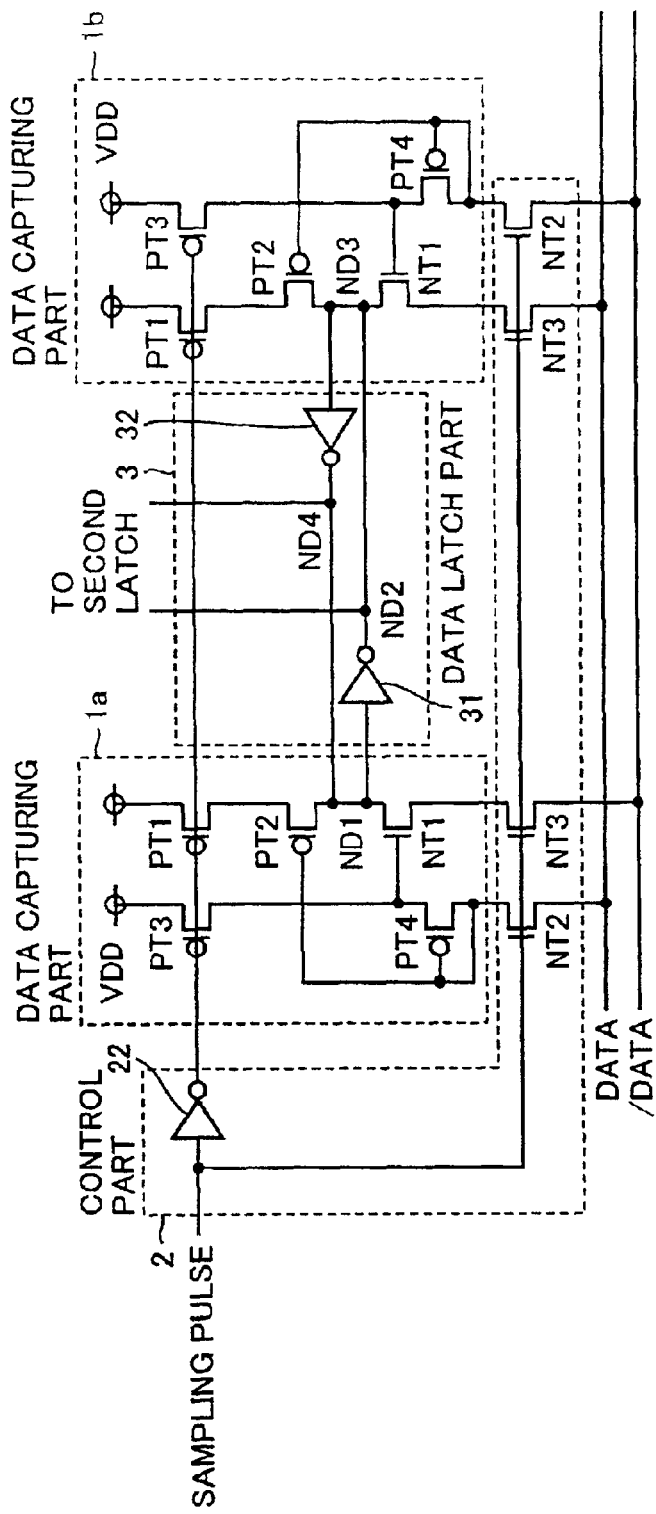
FIG. 9 is a circuit diagram showing the circuit structure of a semiconductor device (data capturing circuit) according to an eighth embodiment of the present invention.

Referring to FIG. 9, a data capturing circuit according to an eight embodiment of the present invention employs two data capturing parts, two control parts and a data latch part on the basis of the structure of the sixth embodiment shown in FIG. 7. The data capturing circuit according to the eighth embodiment comprises two data capturing parts 1*a* and 1*b* having similar structures, a control part 2 including pairs of n-channel transistors NT2 and NT3 and a data latch part 3. Nodes ND3 and ND4 in the data capturing part 1*b* are examples of the "first node" and the "second node" according to the present invention respectively.

According to the eighth embodiment, nodes ND1 and ND2 of the data capturing part 1*a* go low and high respectively when a data line Data is high. In this case, the nodes ND3 and ND4 of the data capturing part 1*b* go high and low respectively. Thus, the nodes ND2 and ND4 are set to different potentials (high and low), whereby stability of data capturing can be improved. In other words, the data capturing circuit having the two data capturing parts 1*a* and 1*b* more hardly causes an error in data determination as compared with that having only one data capturing part, whereby stability in capturing and determination of data can be increased. Thus, the data capturing circuit according to the eighth embodiment can stably operate also when a power supply voltage is reduced or a process is remarkably dispersed to readily unstabilize the circuit operation.

Although the present invention has been described and illustrated in detail, it is clearly understood that the same is by way of illustration and example only and is not to be taken by way of limitation, the spirit and scope of the present invention being limited only by the terms of the appended claims.

For example, while the data capturing circuit according to the aforementioned eighth embodiment is provided with two data capturing parts, two control parts and one data latch part on the basis of the circuit structure according to the sixth embodiment, the present invention is not restricted to this but the data capturing circuit may be provided with two data capturing parts, two control parts and one data latch part on the basis of the structure of any other embodiment (e.g., the fifth embodiment).

While the semiconductor device according to the present invention is applied to a video signal capturing circuit in a liquid crystal display (LCD) in each of the aforementioned embodiments, the present invention is not restricted to this but the semiconductor device according to the present invention is widely applicable to a part requiring a circuit having functions of capturing a low-amplitude signal with a certain starting signal, level-converting a signal voltage and holding data thereof. For example, the inventive semiconductor device may be employed as an address or data capturing circuit in a memory or a video signal capturing circuit in an organic EL display.

While the data capturing part 1 is connected to the internal power supply voltage VD when capturing and determining the data signal in each of the aforementioned embodiments, the data capturing part 1 may alternatively be connected to an external power source.

What is claimed is:

1. A semiconductor device comprising:
    a data input part for receiving a data signal having a prescribed amplitude;
    a control part supplying a synchronous signal for capturing said data signal;
    a data capturing part for capturing said data signal having said prescribed amplitude and determining said data signal while level-converting said data signal of said prescribed amplitude to an amplitude different from said prescribed amplitude in response to said synchronous signal from said control part; and
    a latch part provided independently of said data capturing part for holding said data signal captured in said data capturing part, wherein
    said data capturing part is substantially connected to a power source at least when capturing said data signal and determining said data signal, and including a pair of said data input parts and a pair of said data capturing parts respectively along with single said latch part.

2. The semiconductor device according to claim 1, wherein
    said data capturing part has an asymmetrical circuit structure as viewed from said data input part.

3. The semiconductor device according to claim 1, wherein
    said control part includes a first switching element arranged between said data input part and said data capturing part to enter an ON state in response to said synchronous signal when capturing said data signal.

4. The semiconductor device according to claim 3, wherein
    said data input part includes a data line and an inverted data line, and
    said first switching element includes a first n-channel transistor connected to said data line and a second n-channel transistor connected to said inverted data line.

5. The semiconductor device according to claim 4, wherein said control part further includes an inverter circuit for inverting said synchronous signal.

6. The semiconductor device according to claim 1, wherein
said power source includes an internal power source.

7. A display comprising the semiconductor device according to claim 1.

8. The display according to claim 7, including either a liquid crystal display or an organic EL display.

9. A semiconductor device comprising:
a data input part for receiving a data signal having a prescribed amplitude;
a control part supplying a synchronous signal for capturing said data signal;
a data capturing part for capturing said data signal having said prescribed amplitude and determining said data signal while level-converting said data signal of said prescribed amplitude to an amplitude different from said prescribed amplitude in response to said synchronous signal from said control part; and
a latch part provided independently of said data capturing part for holding said data signal captured in said data capturing part, wherein
said data capturing part is substantially connected to a power source at least when capturing said data signal and determining said data signal,
said data input part includes a data line and an inverted data line,
said data capturing part includes:
a first p-channel transistor having either a source terminal or a drain terminal connected to said power source with remaining said terminal electrically connected to a first node along with a gate terminal connected to said control part, and
a first n-channel transistor having either a source terminal or a drain terminal connected to said first node with remaining said terminal electrically connected to said inverted data line along with a gate terminal electrically connected to said data line,
said latch part includes a first inverter circuit for inverting the potential of said first node, a second node connected to an output terminal of said first inverter circuit and a second inverter circuit connected to said output terminal and an input terminal of said first inverter circuit,
said first p-channel transistor enters an ON state and said first n-channel transistor enters an OFF state so that said first node reaches a high-level potential and said second node goes low when said data line is low, and
said first p-channel transistor enters an ON state and said first n-channel transistor enters an ON state so that said first node reaches a low-level potential and said second node goes high when said data line is high.

10. The semiconductor device according to claim 9, wherein
the resistance ratio between said first p-channel transistor and said first n-channel transistor is so set that said first node goes low when a current flows to said first p-channel transistor and said first n-channel transistor.

11. The semiconductor device according to claim 9, wherein
said control part includes an inverter circuit for inverting said synchronous signal and a transfer gate arranged between said first node of said data capturing part and said first inverter circuit of said latch part.

12. The semiconductor device according to claim 9, wherein
said data capturing part further includes a second p-channel transistor arranged between said first p-channel transistor and said first node so that its gate terminal is connected to said data line.

13. The semiconductor device according to claim 9, wherein
said data capturing part further includes:
a third p-channel transistor having either a source terminal or a drain terminal connected to said power source with remaining said terminal connected to said gate terminal of said first n-channel transistor along with a gate terminal connected to said control part, and
a fourth p-channel transistor having either a source terminal or a drain terminal connected to said third p-channel transistor with remaining said terminal grounded along with a gate terminal electrically connected to said data line.

14. The semiconductor device according to claim 13, wherein
said control part includes an inverter circuit, and
said first p-channel transistor and said third p-channel transistor are driven by said synchronous signal through said inverter circuit of said control part.

15. The semiconductor device according to claim 9, wherein
said data capturing part further includes:
a third p-channel transistor having either a source terminal or a drain terminal connected to said power source with remaining said terminal connected to said gate terminal of said first n-channel transistor along with a gate terminal connected to said control part, and
a fourth p-channel transistor having either a source terminal or a drain terminal connected to said third p-channel transistor with remaining said terminal electrically connected to said data line along with a gate terminal electrically connected to said data line.

16. The semiconductor device according to claim 15, wherein
said control part includes an inverter circuit, and
said first p-channel transistor and said third p-channel transistor are driven by said synchronous signal through said inverter circuit of said control part.

* * * * *